United States Patent [19]
Hashimoto

[11] Patent Number: 5,838,610
[45] Date of Patent: Nov. 17, 1998

[54] SEMICONDUCTOR MEMORY DEVICE HAVING MULTILEVEL MEMORY CELL ARRAY

[75] Inventor: Kiyokazu Hashimoto, Tokyo, Japan

[73] Assignee: NEC Corporation, Tokyo, Japan

[21] Appl. No.: 798,022

[22] Filed: Feb. 6, 1997

[30] Foreign Application Priority Data

Feb. 7, 1996 [JP] Japan .................................. 8-020821

[51] Int. Cl.$^6$ .................................................. G11C 11/56
[52] U.S. Cl. ................ 365/168; 365/185.03; 365/230.03
[58] Field of Search .............................. 365/168, 188.03, 365/185.11, 230.03

[56] References Cited

U.S. PATENT DOCUMENTS 4,661,929  4/1987  Aoki et al. ............................... 365/168
5,680,343  10/1997  Kamaya ............................... 365/185.03

Primary Examiner—Tan T. Nguyen
Attorney, Agent, or Firm—Young & Thompson

[57] ABSTRACT

A semiconductor memory device includes a multilevel memory cell array having a plurality of multilevel memory cells each storing data of at least three bits, a regular memory cell array having a plurality of regular memory cells each storing data of two bits, a first X decoder which selects a word line of the multilevel memory cell array corresponding to an input address, a second X decoder which selected a word line of the regular memory cell array corresponding to the input address, a pulse generator circuit which generates a plurality of pulse signals with mutually different active periods, a voltage generator circuit which generates a control signal whose voltage varies stepwise corresponding to the levels of the plurality of pulses, supplying circuit for supplying the control signal to the selected word line of the multilevel memory cell array, selecting circuit for selecting a bit line of either one of the regular memory cell array or the multilevel memory cell array in response to the input address and an amplifier circuit which amplifiers the level of the selected bit line and outputs the result.

7 Claims, 7 Drawing Sheets

| $V_{TM}$ | $D_{21}$ | $D_{22}$ | $D_{23}$ | DA1 | DA2 |
|---|---|---|---|---|---|
| $V_{T0}{}^{+\alpha}$ | 0 | 0 | 0 | 0 | 0 |
| $V_{T1}{}^{+\alpha}$ | 1 | 0 | 0 | 0 | 1 |
| $V_{T2}{}^{+\alpha}$ | 1 | 1 | 0 | 1 | 0 |
| $V_{T3}{}^{+\alpha}$ | 1 | 1 | 1 | 1 | 1 |

FIG.7

SEMICONDUCTOR MEMORY DEVICE HAVING MULTILEVEL MEMORY CELL ARRAY

BACKGROUND OF THE INVENTION

1. Field of the Invention

The present invention relates to a semiconductor memory device, and more particularly to a semiconductor memory device having both a regular memory cell array and a multilevel memory cell array on one chip.

2. Description of the Related Art

In recent years, office automation equipment has advance remarkably in the expansion of functions and in the reduction of prices. In the field of page printers, for example, the size reduction of the semiconductor memory device to be mounted on the equipment has been substantial. Namely, in such semiconductor memory devices, NAND type semiconductor memory devices (referred to as memories hereinafter) which enable size reduction are being widely adopted.

In FIG. 1 is shown a system diagram of a conventional page printer. As shown in the figure, a central processing unit (CPU) which controls the data read from the memory, a font caching DRAM which temporarily stores font data before sending them out to a print controller which regulates the printing operation of the printer, a mask ROM for program data which stores a program for developing the font data in matrix form for actual printing, and a mask ROM for font data which stores the font data are connected through a system bus.

Here, the storage of a large quantity of data is considered an important factor for the font data mask ROM, so that the NAND type memory which meets this requirement is adopted for the ROM. In contrast, for the program data mask ROM, an increase in the read rate is required for the purpose of improving the operating speed of the printer, and a capacity relatively small compared with that of the font data mask ROM is acceptable, so that the contact program type memory, namely, the NOR type memory which is capable of high speed read access has been employed.

In the conventional semiconductor memory for the printer, the NAND type and the NOR type memories are required separately for the purposes of enlarging the font data capacity and increasing the read rate of the program data, respectively. Under these circumstances, a further reduction in the size of the memory device has been difficult.

BRIEF SUMMARY OF THE INVENTION

Object of the Invention

It is therefore the object of the present invention to provide a semiconductor memory which makes it possible to enlarge the capacity of the font data and increase the read rate of the program data, and reduce the size at the same time.

Summary of the Invention

The semiconductor memory according to this invention includes a multilevel memory cell array having a plurality of multilevel memory cells each of which stores data of at least three bits, a regular memory cell array having a plurality of regular memory cells each of which stores two-bit data, a first X decoder which selects a word line of the multilevel memory cell array that corresponds to an input address, a second X decoder which selects a word line of the regular memory cell array that corresponds to the input address, a pulse generator circuit which generates a plurality of pulse signals with mutually different active periods, a voltage generator circuit which generates a control signal whose voltage varies stepwise in response to the plurality of pulses, supplying means for supplying the control signal to the selected word line of the multilevel memory cell array, selector means for selecting a bit line of either one of the regular memory cell array or the multilevel memory cell array in response to the input address, and an amplifier circuit which outputs the level of the selected bit line after amplifying it.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 7 is a table showing the data for describing the operation of a signal converter of this invention.

DETAILED DESCRIPTION OF THE INVENTION

Figure 1:
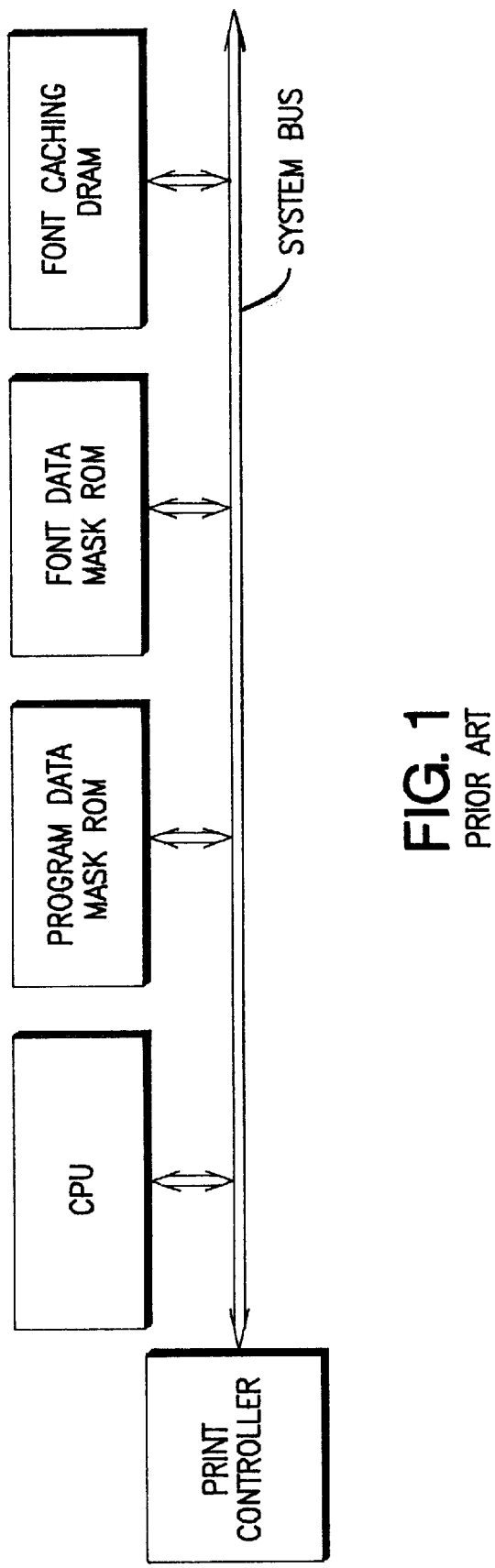
FIG. 1 is a diagram showing a conventional page printer system.
Figure 2:
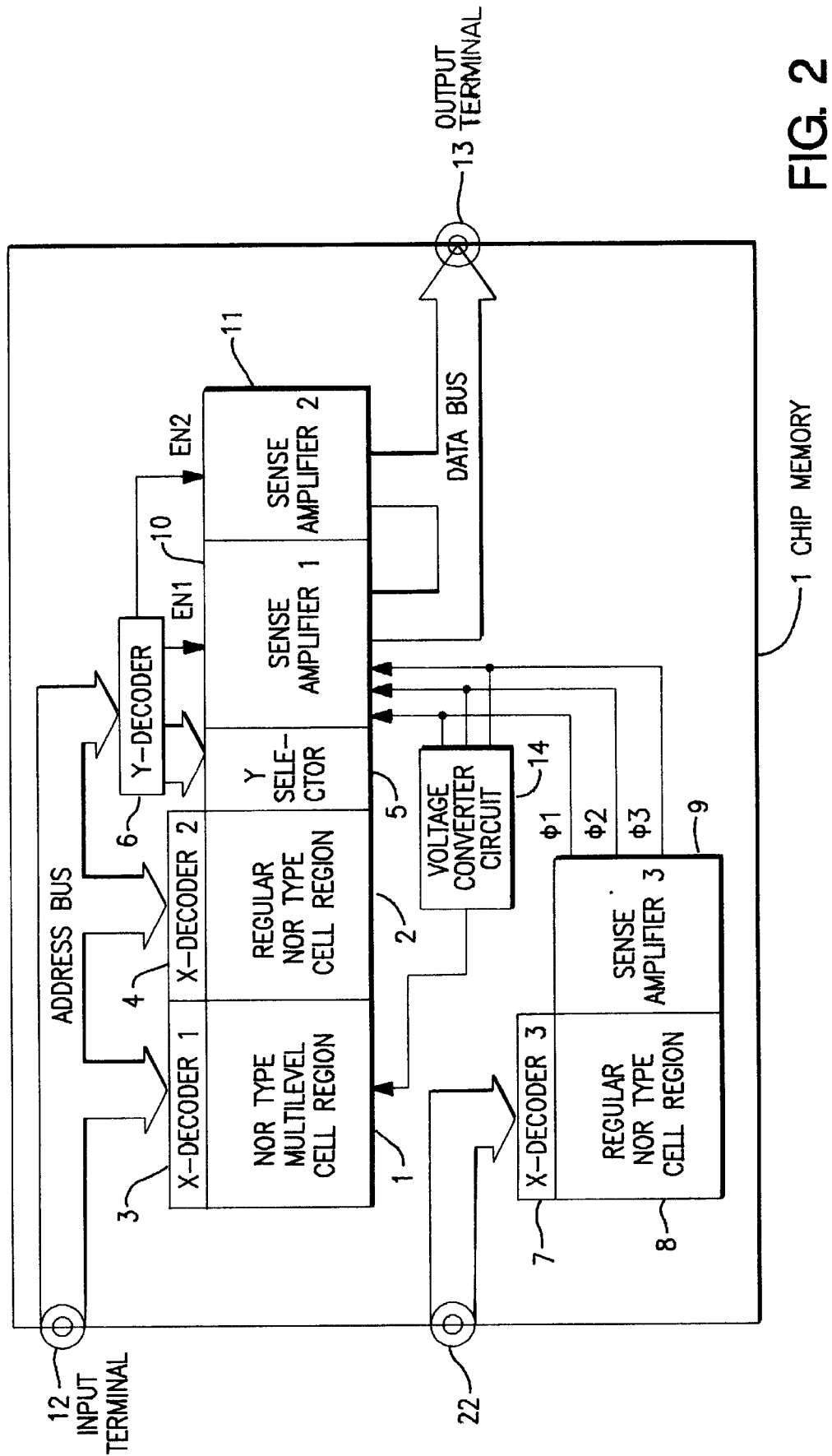
FIG. 2 is a block diagram showing an embodiment of the present invention.

Referring to FIG. 2, the semiconductor memory for a page printer according to this invention will be described. Memories of all of the cell regions 1, 2 and 8 are of the NOR type for which an increase of the read rate is possible. The cell region 1 consists of the multilevel memory cells. The multilevel memory cells have a plurality of threshold voltages where each memory cell is capable of storing data of three or more bits. In this embodiment, multilevel memory cells having four threshold voltages, and hence capable of holding four-bit data, are employed. The cell regions 2 and 8 consist of the regular memory cells. The operation of the semiconductor memory formed where a multilevel memory cell array and two regular memory cell arrays are formed on one chip will be described in the following.

First, the case of an externally situated CPU, not shown in the figure, making an access to the program data mask ROMs will be described. The program data mask ROMs correspond here to regular NOR type cell region 2. When an X address is input to the semiconductor memory through an input terminal 12, the address is transmitted through an address bus and is decoded by an X decoder 2. As a result, data of a specified address of the regular NOR type cell region 2 consisting of the regular memory cells is sent out to a Y selector 5. The Y selector 5 is controlled by a Y decoder 6 which decodes a Y address input to the semiconductor memory through the address bus, and selects a digit line of specified data from among plural pieces of data sent out to the Y selector 5. Since the Y decoder 6 selects a sense amplifier 2 by activating a signal EN2 by the input Y address, the data selected by the Y selector 5 is amplified by the sense amplifier 2, and is output to an output terminal 13 through a data bus.

Next, the case of the CPU making access to the font data mask ROMs will be described. The font data mask ROMs in the present case corresponds to the NOR type multilevel memory cell region 1. In this case, an X address is input to the semiconductor memory through the input terminal 12, and an X decoder 1 decodes the X address. As a result, data of specified address of the NOR type multilevel cell region 1 is sent out to the Y selector 5. The Y selector 5 is controlled by the Y decoder 6 which decodes the input Y address, and selects a digit line of specified data from among plural pieces of data sent out to the Y selector 5. Since the Y decoder 6 selects a sense amplifier 1 by activating a signal EN1 by using input Y address, the data selected by the Y selector 5 is amplified by a sense amplifier 1 and is output to the output terminal 13 through the data bus. However, since the memory cells are multilevel memory cells in this case, it is necessary to provide a special arrangement for the operation of the sense amplifier and the like.

Accordingly, referring to FIG. 3 to FIG. 7, the above-mentioned special operation will further be described in detail.

Figure 3:
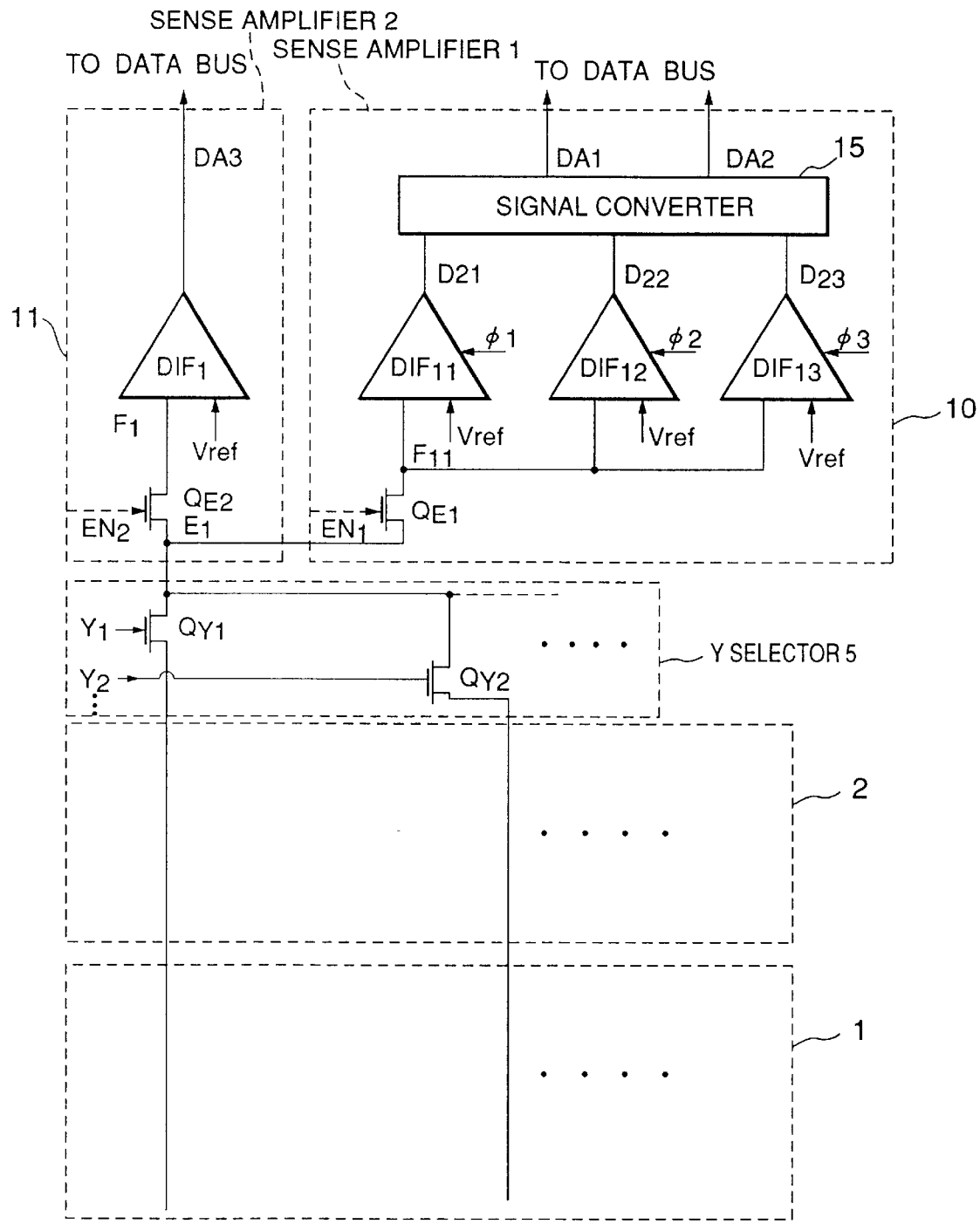
FIG. 3 is a circuit diagram showing the details of a sense amplifier and a selector circuit indicated in FIG. 2.
Figure 4:
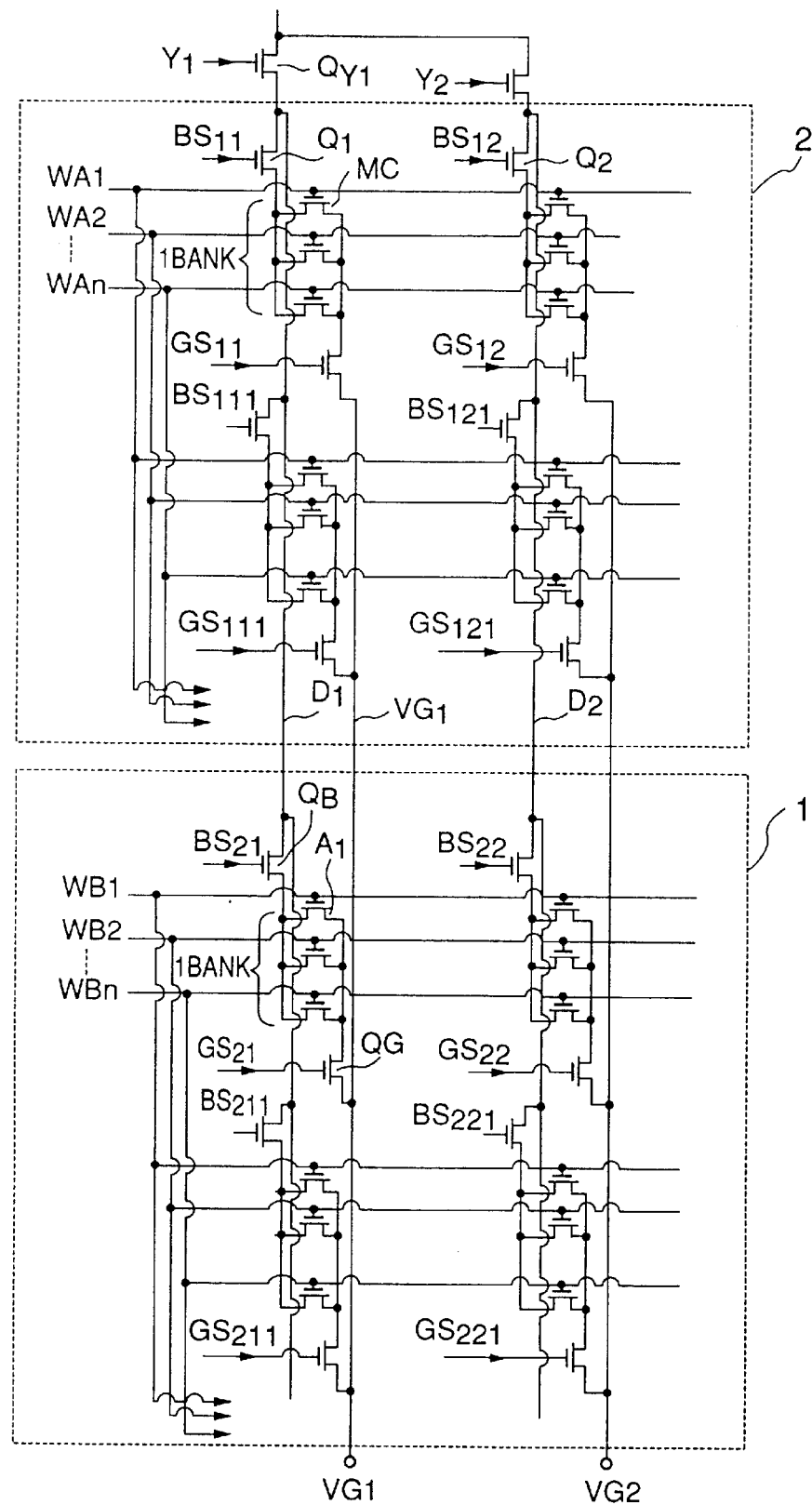
FIG. 4 is a circuit diagram showing the details of a memory cell array part indicated in FIG. 2.

FIG. 3 and FIG. 4 show specific block diagram of the sense amplifier and the memory region, respectively. In FIG. 3, DIF1 is a comparator which outputs a low level signal when the comparison of the potential of a node E1 and a reference potential $V_{ref}$ shows that the potential $V_{ref}$ is higher than the potential of the node E1, and outputs a high level signal when the opposite is true. DIF11, DIF12 and DIF13 are comparators which output a low level signal when the comparison of the potential of a node F11 and the potential $V_{ref}$ shows that the potential $V_{ref}$ is higher than the potential of the node F11, and outputs a high level signal when the opposite is true. The DIF11, DIF12 and DIF13 are activated and carry out their comparison operation when signals ø1, ø2 and ø3, respectively, go to the high level, and their outputs are fixed at the low level when the signals ø1, ø2 and ø3 are at the low level. Further, VG1, VG2, and the like are connected to the ground potential.

As shown in FIG. 4, the multilevel cell region 1 and the regular cell region 2 have the identical circuit configurations. The difference between them resides in the point that the multilevel cells have four kinds of concentration of ions doped into the channel part so as to give rise to four threshold voltages, whereas the regular cells have only two kinds of ion concentrations.

Figure 5:
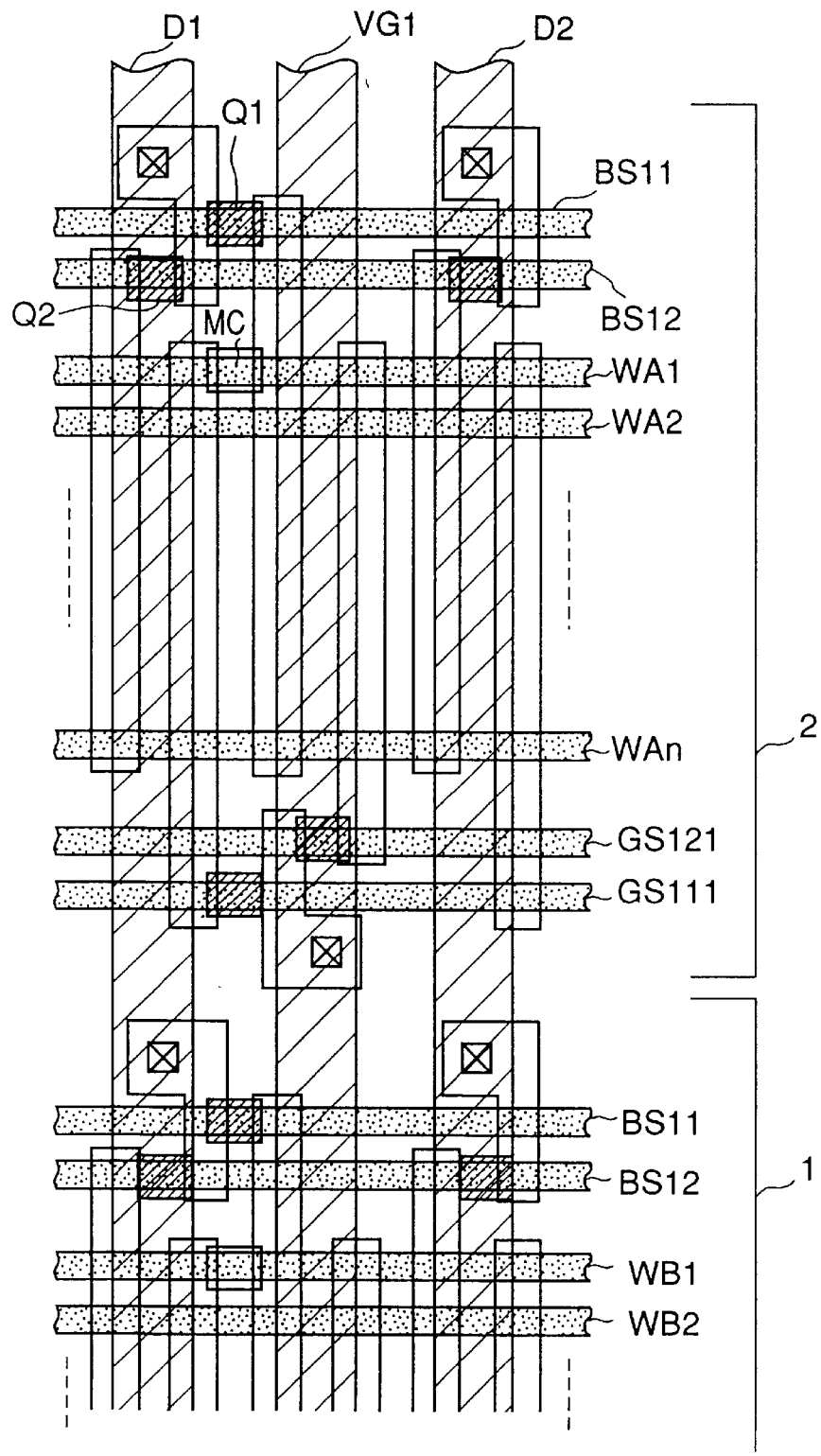
FIG. 5 is a diagram showing the plane pattern of the memory cell array part indicated in FIG. 4.

As shown in FIG. 5, bit lines (or digit lines) D1 and D2, and the ground line VG1 are formed by aluminum wiring provided on the upper layer. Since the circuit configurations of the multilevel cell region 1 and the regular cell region 2 are identical as mentioned above, these wirings D1, D2 and VG1 are formed with the identical pitch (2 µm) for all of them. In other words, there is no need for designing a new pattern when forming the multilevel cell region 1.

Now, suppose that an X address is input and the X decoder 1 selects a memory cell A1 in the multilevel cell region 1. In this case, a block selection line BS21 and a VG selection line GS21 are activated by the X decoder 1, and transistors QB and QG are turned on. Next, a Y address is input and a line Y1 of the Y selector is activated by the Y decoder 6 and a transistor QY1 is turned on. Additionally, the Y decoder 6 activates the line EN1, and a transistor QE1 is turned on. Here, the CPU controls transistors QE1 and QE2 to be turned on alternatively, transistors QY1, QY2, and the like of the Y selector 5 to be turned on alternatively, and the transistors QB and QG within one block BL to be turned on also alternatively. Accordingly, a conductive path connecting the digit line D1 to the junctions E1 and F11 is formed in this case.

Figure 6:
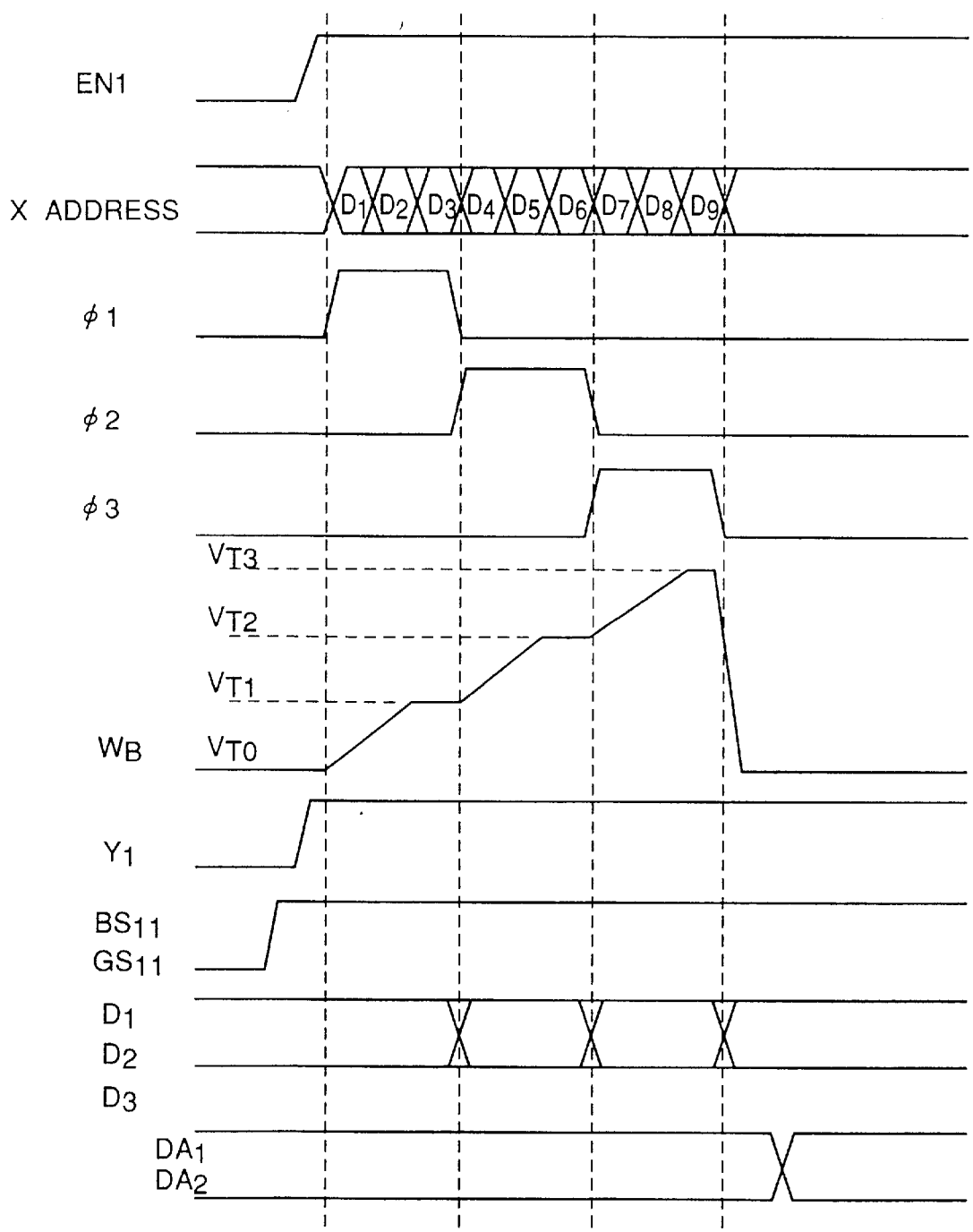
FIG. 6 is an operating waveform diagram of this invention.

At this time, an X address signal is further input from an input terminal 22 (see FIG. 2) as shown in FIG. 6, The X address is for generating signals ø1, ø2, and ø3 which control the sense amplifier 1.

For this signal generation, it is conceivable to utilize, for example, a memory having no Y decoder. In other words, when one word line is selected by one X address, three memory cells are activated in that case. Data appearing on three bit lines corresponding to those activated memory cells are amplified by a sense amplifier, and the results are then output as signals ø1, ø2 and ø3, respectively.

If such a memory is adopted, by storing in advance (1,1,1,0,0,0,0,0,0), (0,0,0,1,1,1,0,0,0) and (0,0,0,0,0,0,1,1,1) in memory cells connected to bit lines outputting signals ø1, ø2 and ø3, respectively, from among memory cells corresponding to X addresses (D1, D2, D3, D4, D5, D6, D7, D8 and D9) of the regular NOR type cell region 8, waveforms as shown in FIG. 6 can be obtained by inputting the X address sequentially to A1 to A. Accordingly, if such a memory is used, it is possible to generate pulse signals having arbitrary pulse widths by means of a setting at the time of manufacturing the device.

Moreover, accompanying the changes in the signals ø1, ø2 and ø3, a voltage conversion circuit 14 changes the voltages of the word lines $W_B$ connected to the gates of the multilevel cell as shown in FIG. 6.

Accordingly, when the threshold voltage $V_{TM}$ of the multilevel cell is set to a potential slightly larger by α than either one of voltages $V_{T0}$ to $V_{T3}$ shown in FIG. 6, it is possible to detect the threshold voltages set for the multi-level cell by varying the potential of the word lines $W_B$. As shown in FIG. 7, when the threshold voltage $V_{TM}$ takes on four values, the signals on lines D21, D22 and D23 output by respective comparators have one set of values corresponding to each threshold, namely, a total of four kinds. A signal converter 15 converts data of the lines D21, D22 and D23, and outputs the resulting data to lines DA1 and DA2. The data output to the lines DA1 and DA2 are output to the output terminal 13 through the data bus.

In the above embodiment, the regular cell is assumed to be a mask ROM, but it may be replaced by an EPROM (electrically programmable memory) or an EEPROM (electrically erasable and programmable memory). Moreover, the multilevel cell is assumed to store data of four levels, but the object of this invention will be attained so long as it stores data of three or more levels.

Although the invention has been described with reference to a specific embodiment, this description is not meant to be construed in a limiting sense. Various modifications of the disclosed embodiment will become apparent to persons skilled in the art upon reference to the description of the invention. It is therefore contemplated that the appended claims will cover any modifications or embodiments as fall within the true scope of the invention.

What is claimed is:

1. A semiconductor memory device comprising:
   a multilevel memory cell array having a plurality of multilevel memory cells, each of said cells storing data of at least three bits,
   a regular memory cell array having a plurality of regular memory cells, each of said regular memory cells storing data of two bits, a first X decoder selecting a word line of said multilevel memory cell array corresponding to an input address, a second X decoder selecting a word line of said regular memory cell array corresponding to said input address, a pulse generator circuit generating a plurality of pulse signals with mutually different active periods, a voltage generator circuit generating a control signal having a voltage which varies in response to said plurality of pulses, said control signal being supplied to the selected word line of said multilevel memory cell array, selecting means for selecting a bit line of one of said regular memory cell array and said multilevel memory cell array in response to said input address, and an amplifier circuit outputting a level of said selected bit line after amplifying it.

2. A semiconductor memory device as claimed in claim 1, wherein said amplifier circuit includes a first sense amplifier, a first switch installed between the output end of said selecting means and said first sense amplifier, a plurality of second sense amplifiers to which are supplied respective members of said plurality of pulse signals, and a signal converter circuit receiving the outputs of said plurality of second sense amplifiers to convert them to two-bit data.

3. A semiconductor memory device as claimed in claim 1, wherein said pulse generator circuit includes a memory circuit and an output circuit reading data of said memory circuit in response to an address information and outputting the read data as said plurality of pulses.

4. A semiconductor memory device comprising:

a bit line, a power supply line laid parallel to said bit line, a plurality of memory transistors arranged in parallel to one another between said bit line and said power supply line, and a plurality of word lines connected to the gates of said plurality of memory transistors, wherein said bit line and said power supply line are each divided into a first and a second region, said plurality of memory transistors arranged within said first region being regular memory transistors and said plurality of memory transistors arranged within said second region being multilevel memory transistors.

5. A semiconductor memory device as claimed in claim 4 further comprising a selector circuit formed at one end of said bit line, a first sense amplifier circuit for amplifying a first output of said selector circuit, and a second sense amplifier circuit for amplifying a second output of said selector circuit.

6. A semiconductor memory device comprising, a first transistor either one of the source or the drain thereof being connected to either one of the source or the drain of a multilevel cell, a second transistor either one of the source or the drain thereof being connected to the other of the source or he drain of said multilevel cell, a third transistor either one of the source of the drain thereof being connected to either one of the source or the drain of a regular cell, and the other of the source or the drain thereof being connected to the other of the source or the drain of said first transistor, a fourth transistor either one of the source or the drain thereof being connected to the other of the source or the drain of said regular cell, and the other of the source or the drain thereof being connected to the other of the source or the drain of said second transistor, a constant power supply connected to said other one of the source or the drain of said second transistor, and a digit line connected to said other one of the source or the drain of said first transistor, wherein said first and second transistors are activated and made electrically conductive when reading out data of said multilevel memory cell to said digit line, and said third and fourth transistors are activated and made electrically conductive when reading out data of said regular memory cell to said digit line.

7. A semiconductor memory device comprising: a multilevel cell connected to a digit line through a gating transistor, a voltage converting circuit which varies the gate voltage of the multilevel cell, a plurality of comparators each equipped with a first and a second input ends, having said first input ends supplied with a reference voltage and said second input ends connected in common to said digit line, and each comparator outputting a result of comparison of the voltages of said first and second input ends, and a signal converter which receives the output results of said plurality of comparators to convert said output results into corresponding data of specified number of bits, wherein for reading out data of said multilevel cell, said gating means electrically connects the digit line to said multilevel cell, said voltage converting circuit sequentially varies said gate voltage, and said plurality of comparators are alternatively activated sequentially whenever said gate voltage is changed.

* * * * *